(12) United States Patent
Kida

(10) Patent No.: US 8,752,937 B2
(45) Date of Patent: Jun. 17, 2014

(54) INKJET HEAD AND INKJET PRINT DEVICE

(75) Inventor: Hitoshi Kida, Atsugi (JP)

(73) Assignee: Ricoh Company, Ltd., Tokyo (JP)

( * ) Notice: Subject to any disclaimer, the term of this patent is extended or adjusted under 35 U.S.C. 154(b) by 204 days.

(21) Appl. No.: 13/411,970

(22) Filed: Mar. 5, 2012

(65) Prior Publication Data

US 2012/0229542 A1    Sep. 13, 2012

(30) Foreign Application Priority Data

Mar. 7, 2011    (JP) .................................. 2011-048741

(51) Int. Cl.
    *B41J 2/05*    (2006.01)
(52) U.S. Cl.
    USPC .............................................. 347/59; 347/60
(58) Field of Classification Search
    USPC ......................................... 347/50, 58, 59, 60
    See application file for complete search history.

(56) References Cited

U.S. PATENT DOCUMENTS

| | | | |
|---|---|---|---|
| 6,616,270 B1 | 9/2003 | Miyata et al. | |
| 6,820,969 B2 | 11/2004 | Miyata | |
| 6,886,923 B2 | 5/2005 | Miyata | |
| 6,966,635 B2 | 11/2005 | Miyata et al. | |
| 7,255,428 B2 | 8/2007 | Hara | |
| 2005/0140736 A1* | 6/2005 | Imanaka et al. | ................ 347/58 |

FOREIGN PATENT DOCUMENTS

| | | |
|---|---|---|
| JP | 2001-146013 | 5/2001 |
| JP | 3422364 | 4/2003 |
| JP | 2004-17600 | 1/2004 |
| JP | 2004-34293 | 2/2004 |
| JP | 2004-74428 | 3/2004 |
| JP | 2006-116767 | 5/2006 |
| JP | 4258605 | 2/2009 |

* cited by examiner

*Primary Examiner* — Julian Huffman
*Assistant Examiner* — Sharon A Polk
(74) *Attorney, Agent, or Firm* — Cooper & Dunham LLP

(57) ABSTRACT

An inkjet head includes a nozzle plate having a plurality of nozzle holes to eject ink droplets, a plurality of ink chambers in which ink is filled, partitioned by sidewalls in communication with the nozzle holes, a plurality of electric conversion elements to generate energy to the ink in the ink chambers for ejecting the ink droplets from the nozzle holes, and an ink chamber plate on which a plurality of drive circuits are mounted to apply a drive voltage to each of the electric conversion elements. Each of the drive circuits includes, on a side face having a pair of long sides and a pair of short sides, drive voltage terminals arranged along one long side to apply the drive voltage to the electric conversion elements via a wiring, input terminals arranged near one short side to which control signals are input, and output terminals arranged near the other short side to output all the control signals.

10 Claims, 7 Drawing Sheets

INKJET HEAD AND INKJET PRINT DEVICE

CROSS REFERENCE TO RELATED APPLICATION

The present application is based on and claims priority from Japanese Patent Application No. 2011-48741, filed on Mar. 7, 2011, the disclosure of which is hereby incorporated by reference in its entirety.

BACKGROUND OF THE INVENTION

1. Field of the Invention

The present invention relates to an inkjet head and an inkjet print device.

2. Description of the Prior Art

An inkjet print device such as an inkjet printer includes an inkjet head to eject ink droplets to a recording medium such as a paper.

The inkjet head is comprised of a nozzle plate with nozzle holes, ink chambers communicating with the nozzle holes, an electric conversion element as a piezoelectric element to generate pressure energy, and an ink chamber plate having a drive circuit for the electric conversion element. Applied with a drive voltage from the drive circuit, the electric conversion element generates pressure onto the ink in the ink chamber so that ink droplets are ejected from the nozzle holes.

In recent years the inkjet head has been downsized with multi-nozzle holes. Japanese Patent Application Publication No. 2006-116767 discloses, for example, such a multi-nozzle, small-size inkjet head including drive voltage output terminals along the long side of one face of a drive circuit for electric conversion elements, to interconnect with the electric conversion elements via wiring, respectively.

The drive circuit or drive IC is configured to receive various control signals from high-order controllers. Because of this, it is necessary to prepare a large space around the drive circuit to provide wirings for receiving the control signals. This hinders a further reduction in the size of the inkjet head.

SUMMARY OF THE INVENTION

An object of the present invention is to provide an inkjet head and an inkjet print device in smaller size which do not require a space around a drive circuit to set wirings for receiving control signals.

According to one aspect, an inkjet head includes a nozzle plate having a plurality of nozzle holes to eject ink droplets, a plurality of ink chambers in which ink is filled, partitioned by sidewalls in communication with the nozzle holes, a plurality of electric conversion elements to generate energy to the ink in the ink chambers for ejecting the ink droplets from the nozzle holes, and an ink chamber plate on which a plurality of drive circuits are mounted to apply a drive voltage to each of the electric conversion elements, each of the drive circuits which includes, on a side face having a pair of long sides and a pair of short sides, drive voltage terminals arranged along one long side to apply the drive voltage to the electric conversion elements via a wiring, input terminals arranged near one short side to which control signals are input, and output terminals arranged near the other short side to output all the control signals.

BRIEF DESCRIPTION OF THE DRAWINGS

Features, embodiments, and advantages of the present invention will become apparent from the following detailed description with reference to the accompanying drawings.

DETAILED DESCRIPTION OF THE PREFERRED EMBODIMENT

Hereinafter, one embodiment of the present invention will be described in detail with reference to the accompanying drawings. Wherever possible, the same reference numbers will be used throughout the drawings to refer to the same or like parts.

First Embodiment

Figure 1:
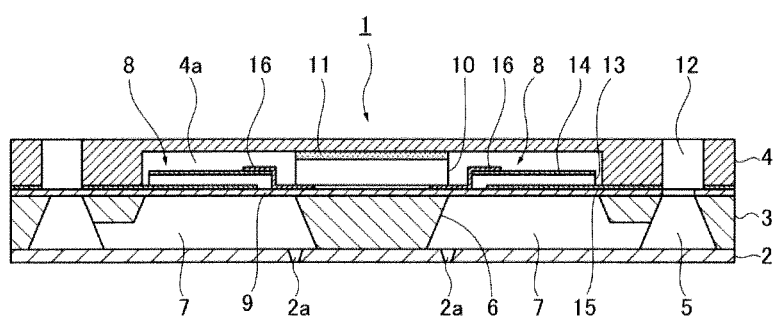
FIG. 1 is a schematic cross section view of the essential part of an inkjet head according to a first embodiment of the present invention.

FIG. 1 is a schematic cross section view of the essential part of an inkjet head according to a first embodiment of the present invention. The inkjet head according to the present embodiment is of a side shooter type to eject ink droplets from the nozzle holes provided in a plate.

In FIG. 1 an inkjet head 1 is comprised of a nozzle plate 2 with nozzle holes 2a, an ink chamber plate 3, and a protective plate 4 bonded with one another. The nozzle plate 2 is for example an SUS plate, and the ink chamber plate 3 is a silicon plate with plane orientation 100 for example. The protective plate 4 is a glass plate for example.

On the ink chamber plate 3 a common chamber 5, partitions 6 and ink chambers 7 separated by the partitions 6 are formed and piezoelectric elements 8 to generate ink ejection energy, a vibration plate 9, and a drive circuit 10 for the piezoelectric elements 8 are arranged.

Note that FIG. 1 shows that the single drive circuit 10 is provided for the nozzle 2a arranged in two rows. However, in the entire inkjet head 1 a plurality of drive circuits are provided in the same manner.

The piezoelectric elements 8 and drive circuit 10 are provided in a concave opening 4a inside the protective plate 4. The vibration plate 9 is placed between the ink chambers 7 of the ink chamber plate 3 and the protective plate 4. The piezoelectric elements 8 are connected to a face of the vibration plate 9 on the protective plate 4 side, and face the ink chambers via the vibration plate 9. The drive circuit 10 is bonded on the inner surface of the protective plate 4 with an adhesive 11.

The vibration plate 9 is open in a communicating portion of the common chamber 5 of the ink chamber plate 3 and a common ink supply path 12 of the protective plate 4.

The piezoelectric elements 8 placed on the top face of the vibration plate 9 are each comprised of a piezoelectric body (PZT) 13, an individual electrode 14 connecting with both faces of the piezoelectric body 13, and a common electrode 15. One end of each individual electrode 14 is connected to a lead electrode 16 which is electrically connected with the drive circuit 10. The drive circuit 10 will be described in detail later.

Figure 2:
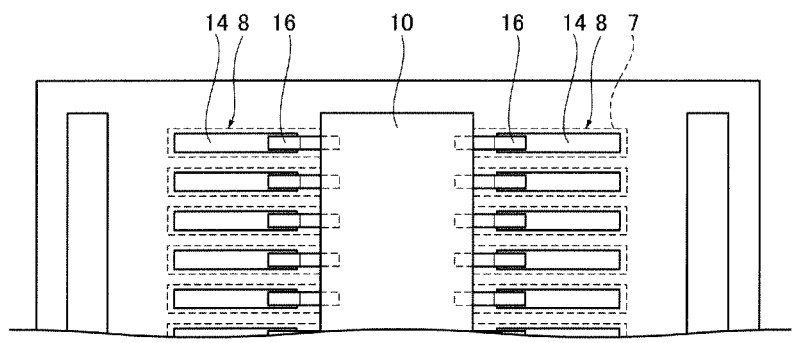
FIG. 2 is a plan view of a drive circuit disposed between piezoelectric elements facing each other.

In FIG. 2 the drive circuit 10 in a rectangular solid is connected with the lead electrodes 16 near the ends of the long sides. FIG. 2 shows the drive circuit 10 with the protective plate 4 removed.

With the ink filled in the ink chambers 7, receiving print data from a not-shown controller, the drive circuit 10 applies a drive voltage to the individual electrodes 14 of the piezoelectric elements 8 corresponding to the nozzle holes 2a to eject ink droplets.

Applied with the drive voltage as above, the piezoelectric bodies 13 of the piezoelectric elements 8 are moved along its thickness to deform or bow the vibration plate 9 to the ink chambers 7, which sharply increases the pressure in the ink chambers 7 and applies pressure to the ink therein to eject or spray ink droplets from the nozzles 2a which communicate with the ink chambers 7.

When the application of the drive voltage to the individual electrodes 14 is stopped, the deformed vibration plate 9 is returned to be in the original position and the pressure inside the ink chambers 7 becomes negative relative to that in the common chamber 5. Along with this, the ink is supplied from outside and filled in the ink chamber 7 through the common ink supply path 12 and the common chamber 5. By repeating the above operation, ink droplets are continuously ejected from the nozzles 2a to create an image as text or graphics on a not-shown recording medium as a paper on the basis of print data supplied from a not-shown controller.

Now, the structure of the drive circuit 10 is described.

Figure 3:
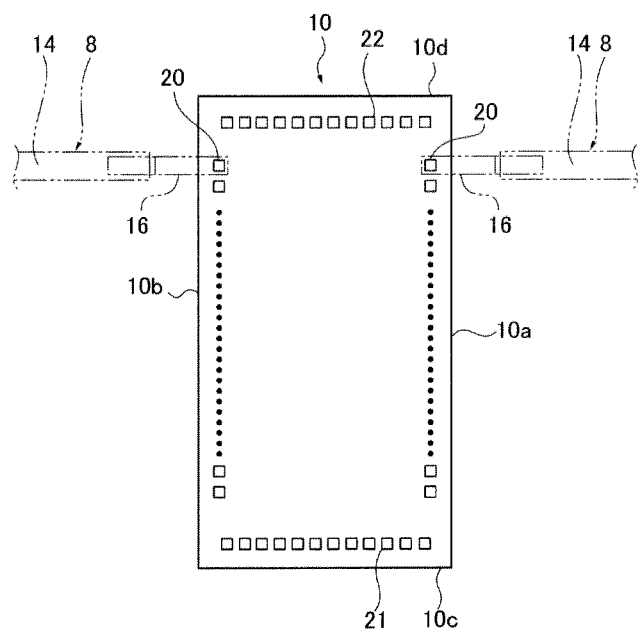
FIG. 3 shows a side face of the drive circuit on which terminals are arranged.

As shown in FIG. 3, first terminals 20 are disposed along the ends 10a, 10b of both the long sides. Second and third terminals 21, 22 are arranged along the ends 10c, 10d of the short sides, respectively. Note that FIG. 3 shows the face of the drive circuit 10 connected with the lead electrodes 16 in FIG. 1.

A not-shown drive IC is mounted in the drive circuit 10 and the first to third terminals 20, 21, 22 are electrically connected by predetermined wiring patterns (not shown).

The first terminals 20 disposed along the long side ends 10a, 10b are output terminals to output the drive voltage to the piezoelectric elements 8. In the inkjet head 1 according to the present embodiment the first terminals 20 are connected with the lead electrodes 16 in FIGS. 1-2 to output the drive voltage to the piezoelectric elements 8 via the individual electrodes 14.

The second terminals 21 disposed along one short side end 10c are input terminals to which various control signals such as data, latch, clock, mode switching, and output permit signals are input from high-order controllers, power supply terminals supplied with drive power and low or high voltage from not-shown power supply sources, and ground terminals.

The third terminals 22 near the other short side end 10d are output terminals to output the various input controls signals, and power supply terminals and ground terminals.

Thus, in the drive circuit 10 the second terminals 21 near the short side end 10c are the input terminals of all the control signals and the third terminals 22 near the short side end 10d are the output terminals of all the control signals.

Accordingly, with the above structure, it is unnecessary to prepare a space around the drive circuit 10 to lay wirings to supply the control signals, resulting in downsizing the entire inkjet head 1.

In the present embodiment the second and third terminals 21, 22 disposed along both of the short sides of the drive circuit 10 include the power supply terminals and ground terminals. However, alternatively, the power supply terminals and ground terminals can be included in either the second or third terminals.

Moreover, the third terminals 22 can be the input terminals of all the control signals while the second terminals 21 can be the output terminals of all the input control signals.

Second Embodiment

Figure 4:
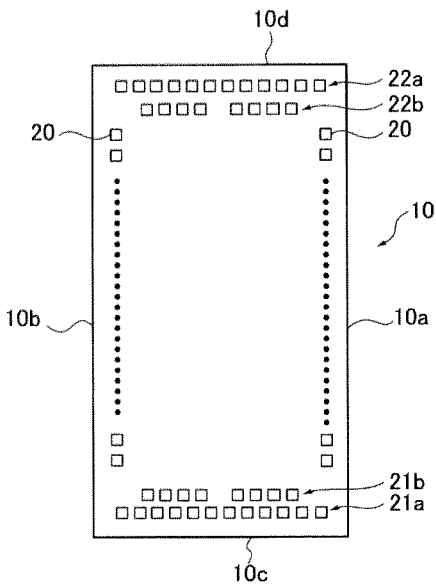
FIG. 4 is a plan view of the side face of the drive circuit on which the terminals are arranged in two rows on both short sides according to a second embodiment.

The drive circuit 10 according to a second embodiment is described with reference to FIG. 4. A difference from that in the first embodiment is in that second terminals 21a, 21b as input terminals are arranged in two rows near the short side end 10c and third terminals 22a, 22b as output terminals are arranged in two rows near the other short side end 10d. The rest of the structures of the drive circuit 10 and the inkjet head 1 are the same as those in the first embodiment.

The second terminals 21a are disposed closer to the end 10c than the second terminals 21b and the number of the second terminals 21b is smaller than that of the second terminals 21a.

Likewise, the third terminals 22a are disposed closer to the end 10d than the third terminals 22b and the number of the third terminals 22b is smaller than that of the third terminals 22a.

For connecting the second terminals 21a, 21b and the third terminals 22a, 22b via wiring by wire bonding, a longer-length wiring is needed for the second and third terminals 21b, 22b in an inside row than for the second and third terminals 21a, 22a in an outside row. This causes a problem that the workability of wiring the inside second and third terminals 21b, 22b is low, elongating the work time for wire bonding.

In view of preventing the above problem, the numbers of the inside second third terminals 21b, 22b are set to be smaller than those of the outside second and third terminals 21a, 22a. Accordingly, an increase in the work time for the wire bonding of the inside terminals 21b, 22b can be avoided with a cost reduction.

Third Embodiment

Figure 5:
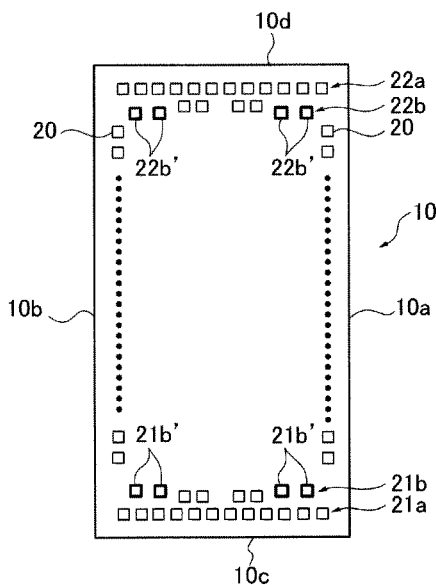
FIG. 5 is a plan view of the side face of the drive circuit on which high-voltage terminals are provided in an inside row according to a third embodiment.

The drive circuit 10 according to a third embodiment is described referring to FIG. 5. As in the second embodiment, the second and third terminals are arranged in two rows along the short side ends 10c, 10d, respectively, the second and third terminals 21a, 22a are disposed closer to the ends 10c, 10d than the second and third terminals 21b, 22b and the numbers of the second and third terminals 21b, 22b are smaller than those of the second and third terminals 21a, 22a.

A difference from that in the second embodiment is in that two second and third terminals 21b', 22b' at both ends of the inside row are set to be high-voltage terminals connected with a high voltage source. The rest of the structures of the drive circuit 10 and inkjet head 1 are the same as those in the second embodiment.

In the present embodiment the high-voltage terminals 21b', 22b' are arranged with a larger interval than the surrounding terminals. This makes it possible to keep a sufficient insulation distance between the high-voltage terminals 21b', 22b' and the surrounding terminals and maintain a good dielectric strength of the high-voltage terminals 21b', 22b' without an increase in the size of the drive circuit 10.

Fourth Embodiment

Figure 6:
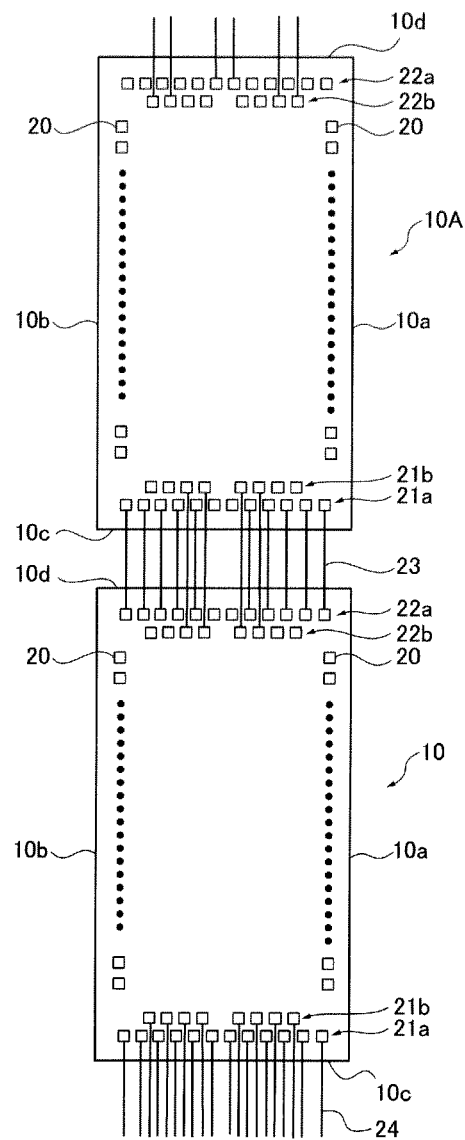
FIG. 6 is a plan view of the side faces of two drive circuits arranged in series of which two opposing short sides are interconnected via a wiring according to a fourth embodiment.

Referring to FIG. 6, the present embodiment describes an example where two drive circuits 10, 10A are disposed in series and the third terminals 22a, 22b of the drive circuit 10 along the short side end 10d are connected with the second terminals 21a, 21b of the drive circuit 10A along the short side end 10d via a first wiring element 23. The two drive circuits 10, 10A are structured the same as the drive circuit 10 in the second embodiment.

The second terminals 21a, 21b along the short side end 10c of the drive circuit 10 are supplied with control signals from a not-shown high-order controller via a second wiring element 24. The input control signals are split in the drive circuit 10 and output to the third terminals 22a, 22b along the short side end 10d.

Then, the control signals are output from the third terminals 22a, 22b to the second terminals 21a, 21b of the second drive circuit 10A via the wiring element 23.

The third terminals 22a, 22b of the drive circuit 10 are connected with the second terminals 21a, 21b of the drive circuit 10A on a one-to-one basis so that all the control signals are output to the drive circuit 10A from the drive circuit 10. In FIG. 6 the power supply terminals and ground terminals of the two drive circuits 10, 10A are not connected via the wiring element 23.

Thus, all the control signals are output via the wiring element 23 from the third terminals 22a, 22b arranged along the short side of the drive circuit 10 to the corresponding second terminals 21a, 21b arranged along the short side of the drive circuit 10A. This accordingly makes it unnecessary to prepare the wiring space for supplying the control signals around each drive circuit, reducing the entire size of the inkjet head.

The present embodiment has described an example where the two drive circuits are arranged in series. Alternatively, three or more drive circuits can be interconnected via the wiring element.

Further, the two drive circuits 10, 10A in FIG. 6 can be interconnected via the wiring element 23 by known wire bonding or flip-chip bonding.

By wire bonding, the drive circuits 10, 10A can be directly interconnected using a conductive wiring element 23. It has an advantage that the wiring for a drive power source can be freely laid on a not-shown circuit board on which the drive circuits 10, 10A are placed.

Figure 7:
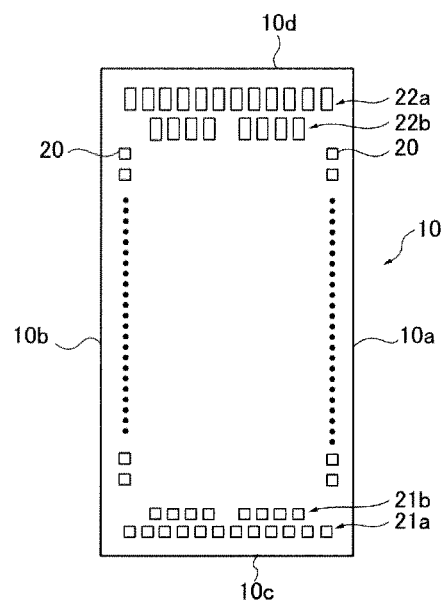
FIG. 7 is a plan view of the side face of the drive circuit on which terminals in different sizes are arranged on both short sides.

Moreover, for interconnecting the second and third terminals 21a, 21b, 22a, 22b via the wiring element by wire bonding, it is preferable that the size of the third terminals 22a, 22b is twice or more that of the second terminals 21a, 21b as shown in FIG. 7, and the second terminals 21a, 22a of a smaller size are connected with the wiring element by a first bonding and the third terminals 22 of a larger size are connected therewith by a second bonding. This can advantageously increase the stability of the wire bonding.

It is further preferable that the second terminals 21a, 22a of a smaller size are set to the inputs of the control signals and the third terminals 22a, 22b of a larger size are set to the outputs of the control signals. Thereby, the short side of the drive circuit 10 and the circuit board are connected by forward bonding in which the terminals at a higher position are connected by a first bonding and those at lower position are connected by a second bonding, which can increase the stability of bonding.

By flip-chip bonding, the wiring element 23 in FIG. 6 is laid on the circuit board on which the drive circuits 10, 10A are mounted. Because of this, the interconnection process can be more efficient than by wire bonding, which can reduce costs for the interconnection.

Fifth Embodiment

Figure 8:
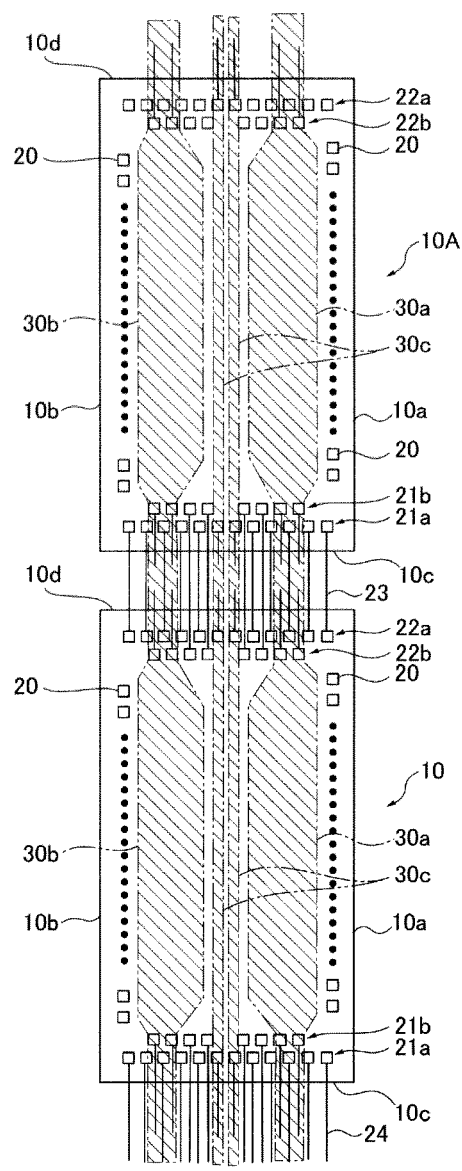
FIG. 8 shows the wiring pattern of a drive power source on a circuit board on which the drive circuit is mounted according to a fifth embodiment.

The drive circuits 10, 10A according to a fifth embodiment is described referring to FIG. 8. In the present embodiment wiring patterns 30a, 30b, 30c (shaded portions) for drive power sources with a large capacity are laid on the front face of the circuit board on which the second and third terminals 21a, 21b, 22a, 22b of the drive circuits 10, 10A are arranged. The rest of the structures of the drive circuits 10, 10A are the same as those in the fourth embodiment.

The wiring patterns 30a, 30b are also laid in a large space on the back face of the circuit board.

Also, the wiring pattern 30c can be laid below the drive circuit 10, 10A on the front face, for example, at the center, for the power supply or ground terminals, as shown in FIG. 8. However, the wiring pattern for the control signals cannot be laid below the drive circuit 10, 10A.

With such a configuration, the wiring patterns for the drive power source with a large capacity are laid in a large space on the circuit board on which the drive circuits 10, 10A are mounted, which can reduce the wiring patterns laid inside the drive circuits 10, 10A. This accordingly contributes to reduction in the size of the drive circuits 10, 10A.

Sixth Embodiment

Figure 9:
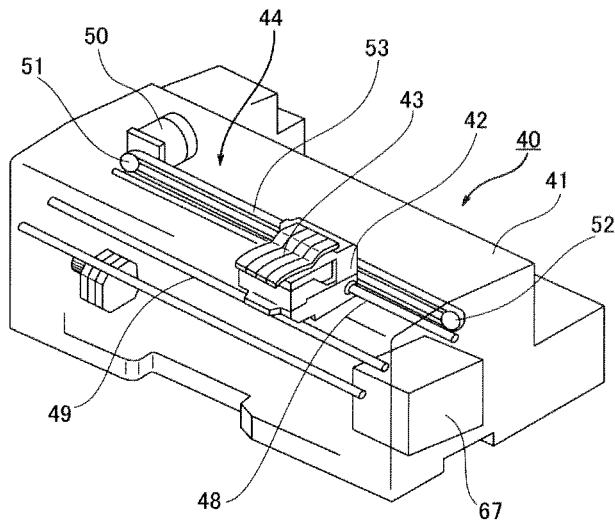
FIG. 9 is a schematic perspective view of the essential part of an inkjet print device according to a sixth embodiment.
Figure 10:
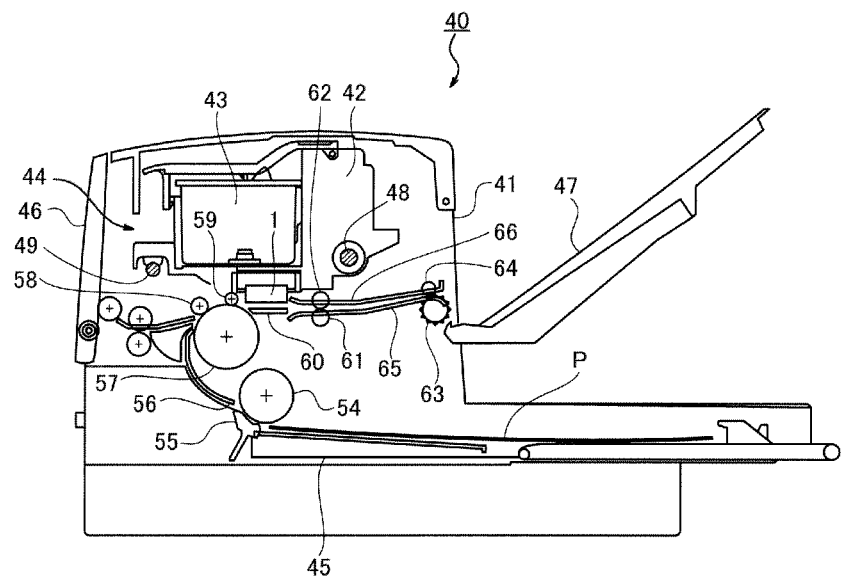
FIG. 10 is a schematic cross section view of the inside of the inkjet print device according to the sixth embodiment.

FIG. 9 is a schematic perspective view of the essential part of an inkjet printer as an inkjet print device according to a sixth embodiment, and FIG. 10 is a schematic cross section view of the inside of the inkjet print device in FIG. 9. The inkjet printer incorporates the inkjet heads 1 according to any one of the first and fifth embodiments.

Referring to FIGS. 9-10, an inkjet printer 40 comprises a body 41 containing a printing unit 44 having a carriage 42 movable in scan direction on which the inkjet heads 1 are mounted, and an ink cartridge 43 to supply ink to the inkjet heads 1, and a paper cassette 45 in which a large number of papers P are stored.

It also includes a manual paper tray 46 on which papers are manually fed, to receive a paper P from the manual paper tray 46 or the paper cassette 45, create a desired image thereon with the printing unit 44 and eject it from a paper output tray 47.

The inkjet heads 1 eject yellow (Y), cyan (C), magenta (M), and black (Bk) ink droplets, respectively and are attached to the carriage 42 so that the nozzle holes as ink outlets are arranged in a direction orthogonal to the main scan direction to eject ink droplets downward in FIG. 9. The carriage 42 is fitted with replaceable ink cartridges 43 to supply the four color ink to the inkjet heads 1.

The ink cartridge 43 includes an opening to communicate with air in a top part, a supply port to supply the ink to the inkjet head 1 in a bottom part and a porous body filled with the ink inside. It can maintain the ink at a very low negative pressure by the capillary force of the porous body. The number of the inkjet heads 1 to eject the respective color ink is four in the present embodiment. However, it can be a single inkjet head having nozzles to eject the four color ink droplets.

The back part or paper feed downstream side of the carriage 42 is slidably fitted into a main guide rod 48 and the front part or paper feed upstream side thereof is slidably placed on a sub guide rod 49. To move the carriage 42 in the main scan direction, a transfer belt 53 is extended between a drive pulley 51 and a driven pulley 52 which are rotated by a motor 50, and is fixed to the carriage 42. The carriage 42 is moved forward and backward by forward and reverse rotation of the motor 50.

To convey the papers P from the paper cassette 45 to below the inkjet heads 1, the inkjet printer 40 includes a feed roller 54 for separately feeding the papers P from the paper cassette 45, a friction pad 55, a guide element 56 for the papers P, a first convey roller 57 for reversing and conveying the fed papers P, a second convey roller 58 pressed onto the circumference of the first convey roller 57, and a head roller 59 to define the angle at which the first convey roller 57 feeds the papers P. The first convey roller 57 is rotated by a not-shown motor having connected gear trains.

Moreover, the inject printer 40 includes a paper guide 60 facing the nozzle holes of the inkjet heads 1, a third convey roller 61 and a wheel 62 to send the papers P in a paper output direction, a paper output roller 63 and a wheel 64 to forward the papers P to the paper output tray 47, and guide elements 65, 66 forming a paper output path at downstream of the paper feed direction.

The inkjet printer 40 creates an image one line at a time by driving the inkjet heads 1 in accordance with an input image signal and spraying ink to the fed paper P while moving the carriage 42 and the paper P. It completes the printing upon receiving a print stop signal or a signal indicating that the back end of the paper has reached a printing area, and discharges the paper P to the paper output tray 47.

Further, a recovery unit 67 is disposed outside the printing area near the right end of the carriage moving area, to resolve an ejection failure of the inkjet heads 1. The recovery unit 67 includes a capping element, a suction element, and a cleaning element. During a print standby, the carriage 42 is moved to the recovery unit 67 and the capping element caps the inkjet heads 1 to keep the nozzle holes wet and prevent an ejection failure due to dried-out ink. Moreover, the inkjet heads 1 are configured to eject ink irreverent of printing to maintain a stable ink ejection with a uniform ink viscosity.

At occurrence of an ink ejection failure, the capping element seals the nozzle holes of the inkjet heads 1, the suction element sucks out air bubbles or the like together with the ink through a tube, and the cleaning element removes residual ink or foreign particles attached to the nozzle holes, to resolve the ejection failure. The suctioned ink is discharged to a not-shown ink residue tank disposed below the body 41 and absorbed into an ink absorbent therein.

Thus, the inkjet printer 40 according to the present embodiment includes the downsized inkjet head 1 so that it can decrease the size accordingly.

Although the present invention has been described in terms of exemplary embodiments, it is not limited thereto. It should be appreciated that variations or modifications may be made in the embodiments described by persons skilled in the art without departing from the scope of the present invention as defined by the following claims.

What is claimed is:

1. An inkjet head comprising:
a nozzle plate having a plurality of nozzle holes to eject ink droplets;
a plurality of ink chambers in which ink is filled, partitioned by sidewalls in communication with the nozzle holes;
a plurality of electric conversion elements to generate energy to the ink in the ink chambers for ejecting the ink droplets from the nozzle holes; and
an ink chamber plate on which a plurality of drive circuits are mounted to apply a drive voltage to each of the electric conversion elements, each of the drive circuits which includes, on a side face having a pair of long sides and a pair of short sides, drive voltage terminals arranged along one long side to apply the drive voltage to the electric conversion elements via a wiring, input terminals arranged near one short side to which control signals are input, and output terminals arranged near the other short side to output all the control signals.

2. An inkjet head according to claim 1, wherein:
the drive circuits are at least two drive circuits arranged in series; and
the output terminals of one of the drive circuits are electrically connected with the input terminals of the other drive circuit via a wiring element, respectively.

3. An inkjet head according to claim 1, wherein:
the input terminals are arranged in rows along the one short side of each of the drive circuits;
the output terminals are arranged in rows along the other short side of each of the drive circuits; and
the input and output terminals are arranged so that a number of the terminals in an inside row is smaller than that of the terminals in an outside row.

4. An inkjet head according to claim 3, wherein:
the input and output terminals in the inside row include high voltage terminals; and
the high voltage terminals are arranged with a predetermined insulation distance from neighboring terminals.

5. An inkjet head according to claim 1, wherein the wiring of the drive voltage is laid below the drive circuits on a circuit board on which the drive circuits are mounted.

6. An inkjet head according to claim 5, wherein the drive circuits are interconnected with the circuit board by wire bonding.

7. An inkjet head according to claim 5, wherein the drive circuits are interconnected with the circuit board by flip-chip bonding.

8. An inkjet head according to claim 6, wherein:
a size of the terminals along the other short side is twice or more that of the terminals along the one short side; and
the terminals having a smaller size are connected by a first bonding while the terminals having a larger size are connected by a second bonding.

9. An inkjet head according to claim 8, wherein the terminals having the smaller size are the input terminals while the terminals having the larger size are the output terminals.

10. An inkjet print device comprising the inkjet head according to claim 1.

* * * * *